US006614310B2

United States Patent
Quarfoot et al.

(10) Patent No.: US 6,614,310 B2
(45) Date of Patent: Sep. 2, 2003

(54) ZERO-OVERHEAD CLASS G AMPLIFIER WITH THRESHOLD DETECTION

(75) Inventors: James Donald Quarfoot, Richardson, TX (US); Marco Corsi, Parker, TX (US); Richard Knight Hester, McKinney, TX (US); Kenneth George Maclean, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/001,330

(22) Filed: Oct. 31, 2001

(65) Prior Publication Data

US 2003/0080816 A1 May 1, 2003

(51) Int. Cl.$^7$ ................................................. H03G 3/20
(52) U.S. Cl. ....................................... 330/297; 330/136
(58) Field of Search ........................... 330/10, 51, 127, 330/136, 297

(56) References Cited

U.S. PATENT DOCUMENTS 6,028,486 A  *  2/2000  Andre ........................ 330/297

* cited by examiner

Primary Examiner—Steven J. Mottola
(74) Attorney, Agent, or Firm—W. Daniel Swayze, Jr.; W. James Brady; Frederic J. Telecky, Jr.

(57) ABSTRACT

The present invention provides an apparatus and method for operating driver amplifier (20) of a line driver circuit (10) from a lower set of power supply voltages, and from a higher set of voltages only when the amplitude of the signal (12) being transmitted by the line driver (20) requires it as determined by a comparator (18). Advantageously, this reduces the power dissipation in the line driver (10) by operating the line amplifier (20) the majority of the time from the lower supply voltage. A delay circuit (14) delays the signal to be amplified sufficient to allow the transitioning of the power supply voltages provided to the amplifier hysteresis of this power supply voltage switching may also be used to further reduce power dissipation.

20 Claims, 1 Drawing Sheet

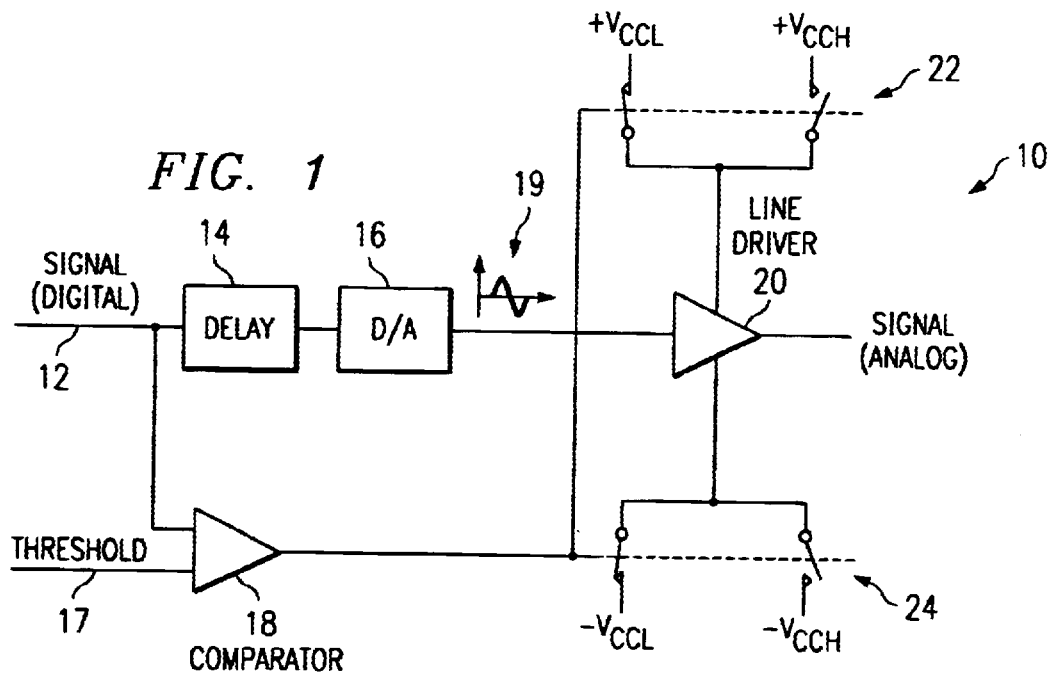
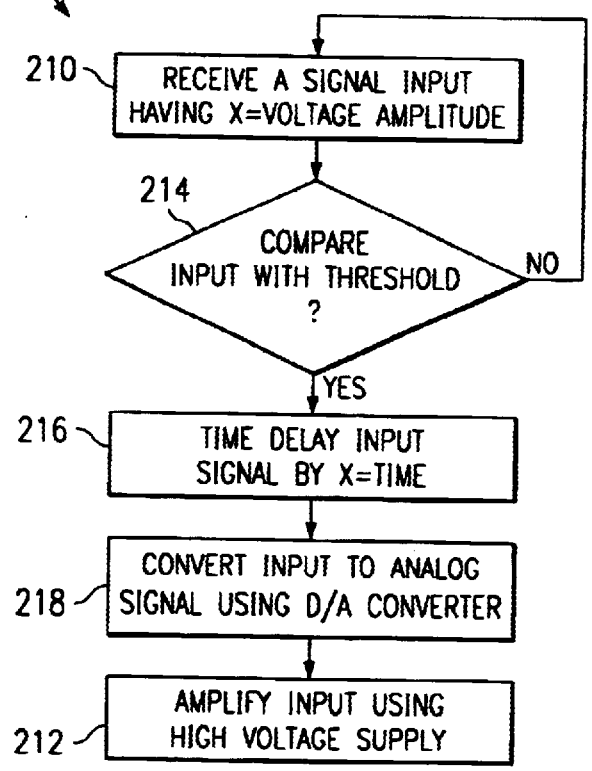

ZERO-OVERHEAD CLASS G AMPLIFIER WITH THRESHOLD DETECTION

TECHNICAL FIELD

The present invention is generally related to the field of line driver devices, and more particularly to an apparatus and method for reducing the overhead power dissipation of an ADSL line driver amplifier.

BACKGROUND OF THE INVENTION

Generally, line drivers used in Central Office (CO) operating Asymmetrical Digital Subscriber Line (ADSL) applications have been known to dissipate too much power. Although progress has been made in the last several years in reducing line driver power dissipation, the demand for increased circuit density in a fixed space with fixed thermal cooling capabilities requires that line driver power dissipation be decreased even further.

Conventional line driver amplifiers are typically Class G topology amplifiers which linearly and continuously transition between the upper and lower power supplies of the amplifier. These power supply voltages typically use varying amounts of current from both supplies depending on the amplitude of the signal being amplified. However, this requires the amplifier to generate an overhead voltage in its output stage so as to prevent distortion in the amplified signal. This overhead voltage significantly increases the power dissipation of the device.

Accordingly, there is needed a line driver device having reduced power dissipation that allows for higher density packaging of ADSL circuits.

SUMMARY OF THE INVENTION

The present invention achieves technical advantages as a line driver circuit that takes advantage of the "peaky" nature of an ADSL signal by running a line driver amplifier from a lower set of power supply voltages as a baseline, and from a higher set of voltages only when the amplitude of the signal being transmitted requires it. Advantageously, this reduces the power dissipation in the line driver by operating the line driver the majority of the time from the lower supply voltage.

In one embodiment, the invention is an ADSL line driver circuit with reduced power consumption capabilities. The line driver circuit includes an amplifier amplifying the input signal. Preferably, a switching circuit is adapted to selectively establish which power supply voltages are driving the line amplifier. This switching is initiated in response to detecting the voltage amplitude of the input signal reaching a predetermined threshold level.

In another embodiment, the invention is a method for reducing the power consumption of an ADSL line driver circuit, where the method includes the steps of receiving a input signal having a voltage amplitude, and amplifying the input signal using an amplifier in response to the detected amplitude of the input signal. The amplifier is discretely powered by a selected power supply voltage. Advantageously, the line driver amplifier is discretely switched between an upper and lower set of supply voltages in order to draw required current from either the upper or lower power supplies as a function of the input signal amplitude. A delay circuit issued to allow the switching of power supplies driving the amplifier.

BRIEF DESCRIPTION OF THE DRAWINGS

For a more complete understanding of the present invention, reference is made to the following detailed description taken in conjunction with the accompanying drawings wherein:

FIG. 1 shows an ADSL line driver driven by multiple power supplies and responsive to a threshold detection circuit in accordance with the present invention; and FIG. 2 illustrates an algorithm for reducing the power consumption of an ADSL line driver circuit in accordance with the exemplary embodiment of the present invention.

DETAILED DESCRIPTION OF PREFERRED EMBODIMENT

The numerous innovative teachings of the present application will be described with particular reference to the presently preferred exemplary embodiments. However, it should be understood that this class of embodiments provides only a few examples of the many advantageous uses and innovative teachings herein. Moreover, some statements may apply to some inventive features, but not to others.

FIG. 1 shows an ADSL line driver circuit 10 discretely operating from different power supplies and having a threshold detection circuit in accordance with the present invention. The line driver circuit 10 includes a delay circuit 14, a D/A converter 16, and a comparator 18. The line driver circuit 10 is also seen to include a line driver amplifier 20, as well as switches 22 and 24 which selectively couple one of the two sets of power supplies to the power supply terminals of the amplifier 20 as a function of the input signal amplitude. In operation, the present invention reduces the power dissipation in the line driver 20 by operating the line driver 20 from a lower set of power supply voltages (+/−VCCL) the majority of the time. By using switches 22 and 24, the amplifier transitions between at least two power supplies, the line amplifier's 20 overhead voltage is reduced and its power dissipation is diminished.

As shown, the comparator 18 determines and controls when the switches 20 and 27 switch the line driver amplifier 20 between power supplies by comparing an input signal 12 to be amplified with a predetermined threshold value 17. If, for example, the amplitude of the transmitted signal 12 is determined to exceed a predetermined threshold 17 and amplifier 20 needs a higher power supply voltage to support it, the line driver 20 is responsively and discretely switched to the higher supplies (+/−VCCH) by switches 22 and 24. Conversely, the comparator 18 discretely returns the line driver 20 to the lower supplies (+/−VCCL) when the signal 12 determined by comparator 18 to be is less than the threshold 17.

In this instance, although switching between two power supply voltages is illustrated, limitation on the number power supplies to which the line driver amplifier 20 may be switched is not to be inferred and more than two power supply sets could be utilized. Moreover, although the input signal 12 is illustrated as an ADSL signal, commonly a digital signal, it should be understood that any number of signals may be inputted through the line driver circuit 10, such as an analog signal, for example according to the present invention.

In the selected embodiment, the invention is seen to include a delay circuit 14 having the input signal 12 passed therethrough. Delay circuit 14 is adapted to delay the input signal longer than the comparator processing time in order to allow time for the line driver power supply switches 22 and 24 to transition the corresponding voltage levels to the amplifier 20. That is, when comparator 18 determines that the input signal 12 is to be amplified by line driver 20 operating from a different set of power supplies, the delay circuit 14 delays the input sufficiently long to allow both detection by comparator 18 and switching by switches 22 and 24, such as 0.5 μsec.

In yet another embodiment, greater power reduction can be achieved by applying hysteresis to the switching thresholds of comparator 18 such that the falling edge threshold voltage is higher than the rising edge threshold, thus advantageously keeping the lower overhead power supply voltage on the output transistors of the line driver amplifier 20 lower during the falling edge.

Referring to FIG. 2, there is illustrated a line driver power reduction algorithm 200 in accordance with present invention. The power reduction algorithm 200 begins with a receiving act 210 where the input signal 12, preferably an digital signal, is received by a delay circuit 14, as depicted in FIG. 1.

Next, a switching act 214 discretely transitions the amplifier 20 to operate from between a lower and a higher power supply, or vice versa, based on the amplitude of input signal 12. Specifically, the switching act 214 comprises comparing the amplitude of the input signal 12 with the threshold value 17. Delay act 216 momentarily delays the input signal 12 before it is coupled to D/A converter 16, where a converting act 218 converts the input signal 12 to an analog signal 19. The switching act 214 is followed by an amplifying act 212 which amplifies the analog signal 19.

As such, in the preferred embodiment, the present invention is able to transition between the upper and lower power supplies of the amplifier 20 in response to a signal generated by comparator 18. If, for example, the input signal 12 is less than the threshold value 17, the comparator 18 responsively triggers switches 22 and 24 to operate the line amplifier 20 at the lower supply voltages. If, however, the comparator determines that the input signal 12 exceeds the predetermined threshold value 17, the comparator 18 responsively triggers the switches 22 and 24 to operate the line amplifier 20 at the higher supply voltages and to draw a higher required current.

Accordingly, the invention advantageously monitors the changing voltage amplitude of the input signal 12—which is normally amplified by line amplifier 20 running from a lower set power supply voltages—and discretely switches the line amplifier 20 to operate from a higher set of power supply voltages when the transmitted analog signal 19 needs it. By discretely transitioning between a plurality of power supply voltages, the invention reduces the power dissipation in the line driver circuit 10 by operating the line driver amplifier 20 the majority of the time from a lower supply voltage.

Though the invention has been described with respect to specific preferred embodiments, many variations and modifications will become apparent to those skilled in the art upon reading the present application. It is therefore the intention that the appended claims be interpreted as broadly as possible in view of the prior art to include all such variations and modifications.

What is claimed is:

1. A line driver power reduction circuit, comprising:
   an amplifier having power supply terminals, said amplifier receiving said input signal and providing an amplified output signal;
   a comparator comparing said input signal with a threshold value and providing a control signal indicative of the voltage amplitude of said input signal in relation to a threshold value;
   a plurality of switches coupled to said power supply terminals, said switches, in response to said comparator control signal coupling one of two sets of power supply voltages to said amplifier supply terminals; and
   a delay circuit delaying said input signal provided to said amplifier and adapted to allow time for said switches to transition between said power supply voltages.

2. The circuit of claim 1 wherein said switches discretely transition the power supply terminals between the power supply voltages.

3. The circuit of claim 1 wherein said delay circuit receives a digital signal.

4. The circuit of claim 2 further comprising a D to A converter converting said input signal to an analog signal provided to said amplifier.

5. The circuit of claim 1 wherein said switches selectively couple a first power supply to said amplifier when said input signal is below said threshold value, and selectively couple a second power supply being higher than said first power supply to said amplifier when said input signal exceeds said threshold value.

6. The circuit of claim 5 wherein said switches provide hystersis to said power supply switching in relation to said threshold value.

7. The circuit of claim 1 wherein said amplifier is configured as an ADSL line driver amplifier.

8. A method of reducing the power dissipation of a line driver circuit, comprising the steps of:
   providing a power supply voltage to a line driver amplifier at a first predetermined level; and
   discretely switching said power supply voltage provided to the line driver amplifier from said first predetermined level to a higher second predetermined level as a function of the amplitude of a signal being provided to said line driver amplifier.
   wherein said switching step further comprises the step of delaying the signal provided to the amplifier as a function of a transition time for the power supply switching step.

9. The method of claim 8 wherein said switching step comprises the step of comparing the amplitude of said signal with a predetermined threshold value using a comparator.

10. The method of claim 8 wherein said line driver amplifier operates a majority of the time from said power supply voltages at said first predetermined level.

11. The method of claim 9 wherein said line driver amplifier operates from the power supply voltage at the first predetermined level when the signal is less than the predetermined threshold value.

12. The method of claim 8 wherein said line driver amplifier is configured to amplify an analog said signal.

13. The method of claim 12 further comprising the act of converting said signal from a digital signal to said analog signal.

14. A method of reducing the power dissipation of a line driver circuit, comprising the steps of:
   receiving an input signal; and
   amplifying said input signal with a line driver circuit by discretely switching a supply voltage provided to the line driver circuit selectively between a first level and a higher second level responsive to an amplitude of said input signal; and
   delaying the input signal for a predetermined time period before being amplified, wherein said time period corresponds to said comparator comparison time.

15. The method of claim 14 further comprising the step of comparing the amplitude of said input signal with a predetermined threshold value using a comparator, and selectively switching said supply voltage between said first level and said second level as a function of said comparison.

16. A line driver power reduction circuit, comprising:
a control circuit monitoring an amplitude of an input signal;
an amplifier having a plurality of power supply terminals amplifying said input signal, wherein said control circuit discretely selects which of a plurality of power supply voltages are coupled to said power supply terminals as a function of a voltage amplitude of said input signal; and
a delay circuit adapted to allow time for said power supply voltage levels to transition before said input signal is provided to said amplifier.

17. The circuit of claim 16 wherein said input signal is a digital signal.

18. The circuit of claim 17 wherein the power reduction circuit further comprises a D/A converter, said converter is adapted to convert said digital signal to an analog signal provided to the amplifier.

19. The circuit of claim 16 wherein said control circuit comprises a comparator receiving a threshold value and said input signal, said comparator generating a signal indicative of the voltage amplitude of said input signal in relation to threshold value.

20. The circuit of claim 19 wherein said control circuit further comprises a plurality of switches, said switches transitioning between said power supply voltages in response to said output signal of said comparator.

* * * * *